United States Patent
Auth et al.

(10) Patent No.: US 8,632,687 B2
(45) Date of Patent: Jan. 21, 2014

(54) METHOD FOR ELECTRON BEAM INDUCED ETCHING OF LAYERS CONTAMINATED WITH GALLIUM

(75) Inventors: Nicole Auth, Gustavsburg (DE); Petra Spies, Mainz (DE); Rainer Becker, Pfungstadt (DE); Thorsten Hofmann, Rodgau (DE); Klaus Edinger, Lorsch (DE)

(73) Assignee: Carl Zeiss SMS GmbH, Jena (DE)

( * ) Notice: Subject to any disclaimer, the term of this patent is extended or adjusted under 35 U.S.C. 154(b) by 191 days.

(21) Appl. No.: 13/058,635

(22) PCT Filed: Aug. 11, 2009

(86) PCT No.: PCT/EP2009/005823
§ 371 (c)(1),
(2), (4) Date: Apr. 13, 2011

(87) PCT Pub. No.: WO2010/017963
PCT Pub. Date: Feb. 18, 2010

(65) Prior Publication Data
US 2011/0183523 A1    Jul. 28, 2011

(30) Foreign Application Priority Data
Aug. 14, 2008 (DE) .......................... 10 2008 037 951

(51) Int. Cl.
*H01L 21/302* (2006.01)
(52) U.S. Cl.
USPC .................... 216/12; 216/62; 216/63; 216/66; 216/72; 216/75; 438/706; 257/E21.214

(58) Field of Classification Search
None
See application file for complete search history.

(56) References Cited

U.S. PATENT DOCUMENTS

| | | | |
|---|---|---|---|
| 4,226,666 A | 10/1980 | Winters et al. | |
| 4,639,301 A | 1/1987 | Doherty et al. | |
| 4,851,097 A * | 7/1989 | Hattori et al. | 204/192.33 |
| 4,874,459 A * | 10/1989 | Coldren et al. | 438/9 |
| 5,055,696 A * | 10/1991 | Haraichi et al. | 250/492.2 |
| 5,188,705 A * | 2/1993 | Swanson et al. | 204/192.34 |
| 5,273,935 A | 12/1993 | Morimoto et al. | |
| 5,501,893 A | 3/1996 | Laermer et al. | |
| 5,683,547 A * | 11/1997 | Azuma et al. | 438/695 |
| 6,042,738 A | 3/2000 | Casey, Jr. et al. | |

(Continued)

FOREIGN PATENT DOCUMENTS

| | | |
|---|---|---|
| DE | 102 61 035 A1 | 10/2003 |
| DE | 103 38 019 A1 | 3/2005 |

(Continued)

OTHER PUBLICATIONS

English translation of International Preliminary Report on Patentability for corresponding PCT Appl. No. PCT/EP2009/005823.

(Continued)

*Primary Examiner* — Allan Olsen
(74) *Attorney, Agent, or Firm* — Fish & Richardson P.C.

(57) ABSTRACT

The invention relates to a method for electron beam induced etching of a layer contaminated with gallium, with the method steps of providing at least one first halogenated compound as an etching gas at the position at which an electron beam impacts on the layer, and providing at least one second halogenated compound as a precursor gas for removing of the gallium from this position.

24 Claims, 3 Drawing Sheets

(56) References Cited

U.S. PATENT DOCUMENTS

| | | | |
|---|---|---|---|
| 6,639,226 B2 * | 10/2003 | Morio et al. | 250/491.1 |
| 6,753,538 B2 | 6/2004 | Musil et al. | |
| 6,787,783 B2 * | 9/2004 | Marchman et al. | 250/492.2 |
| 6,897,157 B2 * | 5/2005 | Liang et al. | 430/5 |
| 6,991,878 B2 * | 1/2006 | Kanamitsu et al. | 430/5 |
| 7,095,021 B2 * | 8/2006 | Shichi et al. | 250/307 |
| 7,172,839 B2 * | 2/2007 | Sugiyama et al. | 430/5 |
| 7,368,729 B2 * | 5/2008 | Shichi et al. | 250/442.11 |
| 7,391,039 B2 | 6/2008 | Kitamura et al. | 250/492.3 |
| 7,662,524 B2 * | 2/2010 | Stewart et al. | 430/5 |
| 7,670,956 B2 * | 3/2010 | Bret et al. | 438/709 |
| 7,692,163 B2 * | 4/2010 | Nagano | 250/492.2 |
| 7,727,681 B2 * | 6/2010 | Stewart et al. | 430/5 |
| 7,927,770 B2 * | 4/2011 | Kanamitsu | 430/5 |
| 8,076,650 B2 * | 12/2011 | Smith et al. | 250/423 R |
| 8,110,814 B2 * | 2/2012 | Ward et al. | 250/423 F |
| 2003/0020176 A1 | 1/2003 | Nambu | |
| 2003/0047691 A1 | 3/2003 | Musil et al. | |
| 2003/0215722 A1 | 11/2003 | Kanamitsu et al. | |
| 2003/0224601 A1 | 12/2003 | Roy et al. | |
| 2004/0048398 A1 * | 3/2004 | Liang et al. | 438/3 |
| 2004/0113097 A1 * | 6/2004 | Marchman et al. | 250/492.2 |
| 2004/0131953 A1 * | 7/2004 | Sugiyama et al. | 430/5 |
| 2004/0151991 A1 * | 8/2004 | Stewart et al. | 430/5 |
| 2004/0226814 A1 | 11/2004 | Stewart et al. | |
| 2005/0014383 A1 | 1/2005 | Ji et al. | |
| 2005/0108892 A1 * | 5/2005 | Wu et al. | 34/444 |
| 2006/0030064 A1 * | 2/2006 | Roy et al. | 438/24 |
| 2006/0037182 A1 * | 2/2006 | Roy et al. | 29/25.01 |
| 2006/0115966 A1 * | 6/2006 | Roy et al. | 438/510 |
| 2006/0134920 A1 | 6/2006 | Liang | |
| 2006/0147814 A1 * | 7/2006 | Liang | 430/5 |
| 2006/0228634 A1 * | 10/2006 | Bret et al. | 430/5 |
| 2007/0010097 A1 * | 1/2007 | Deering et al. | 438/690 |
| 2007/0087572 A1 * | 4/2007 | Le Roy et al. | 438/712 |
| 2007/0158304 A1 | 7/2007 | Nasser-Ghodsi et al. | |
| 2007/0187622 A1 * | 8/2007 | Nagano | 250/492.21 |
| 2007/0267579 A1 * | 11/2007 | Sugiyama et al. | 250/397 |
| 2009/0111036 A1 * | 4/2009 | Stewart et al. | 430/5 |
| 2009/0309018 A1 * | 12/2009 | Smith et al. | 250/282 |
| 2010/0186768 A1 * | 7/2010 | Kanamitsu | 134/1.1 |
| 2010/0203431 A1 * | 8/2010 | Bret et al. | 430/5 |
| 2010/0282596 A1 | 11/2010 | Auth et al. | |
| 2011/0183444 A1 | 7/2011 | Auth et al. | |
| 2012/0080407 A1 * | 4/2012 | Smith et al. | 216/66 |

FOREIGN PATENT DOCUMENTS

| | | | | |
|---|---|---|---|---|
| DE | 11 2006 000 129 T5 | 11/2007 | | |
| EP | 1 664 924 | 6/2006 | | |
| JP | 08250478 A | 9/1996 | | C23F 4/00 |
| JP | 2005159287 A | 6/2005 | | G03F 1/72 |
| JP | 2006515937 A | 6/2006 | | B01J 19/08 |
| JP | 2006319105 A | 11/2006 | | B23K 15/00 |
| WO | WO 03/003118 | 1/2003 | | |
| WO | WO 2004/066027 A2 | 8/2004 | | |
| WO | WO 2004066027 A2 * | 8/2004 | | |
| WO | WO 2005/017949 A2 | 2/2005 | | |
| WO | WO 2006/074198 A2 | 7/2006 | | |
| WO | 2007/025039 | 3/2007 | | H01L 21/3065 |
| WO | WO 2007/100933 A2 | 9/2007 | | |
| WO | WO 2009/080707 | 7/2009 | | |
| WO | WO 2010/017987 | 2/2010 | | |

OTHER PUBLICATIONS

Watanabe et al., "Low-Damage Electron-Beam-Assisted Dry Etching of Gaas and Aigaas Using Electron Using Electron Cyclotron Resonance Plasma Electron Source," J. Vac. Sci. Technol. B (11)6, Nov./Dec. 1993, pp. 2288-2293.

Yoshida et al., "The effect of EB irradiation with and without hot-jet C12 on an ultra-thin GaN layer for selective etching," Applied Surface Science, 100/101 (1996) 184-188.

International Search Report for corresponding PCT Appl. No. PCT/EP2009/005823, mailed Nov. 10, 2009.

Randolph et al., "Focused, nanoscale-electron-beam-induced deposition and etching," Critical Reviews in Solid State and Materials Sciences, CRC Press, Boca Raton, FL, vol. 31, No. 3, Sep. 1, 2006, pp. 55-89.

Lassiter et al., "Inhibiting spontaneous etching of nanoscale electron beam induced etching features: Solutions for nanoscale repair of extreme ultraviolet lithography masks," J. Vac. Sci. Technol., vol. 26, No. 3, May 2008, pp. 963-967.

Matsui et al., "Direct writing onto Si by electron beam stimulated etching," Appl. Phys. Lett. 51(19), 1498 (1987).

H.F. Winters et al., "The etching of silicon with $XeF_2$ vapour", Appl. Phys. Lett. 34(1), 70 (1979).

J.W. Coburn et al., "Ion and electron-assisted gas-surface chemistry—An important effect in plasma etching", J. Appl. Phys. 50(5), 3189 (1979).

K. Tsujimoto et al., "A New Side Wall Protection Technique in Microwave Plasma Etching Using a Chopping Method", Conf. on Solid State Devices and Materials, 229-233, Tokyo 1986.

Leonhardt et al., "Etching with electron beam generated plasmas," J. Vac. Sci. Technol. A 22(6):2276-2283, Nov./Dec. 2004.

Notification of Reasons for Refusal, Japanese Patent Application No. 2011-522428, English Translation provided, 6 pages, Jun. 10, 2013.

* cited by examiner

METHOD FOR ELECTRON BEAM INDUCED ETCHING OF LAYERS CONTAMINATED WITH GALLIUM

1. TECHNICAL FIELD

The present invention relates to a method for electron beam induced etching of layers with implanted gallium.

2. PRIOR ART

Etching processes have an important roll in industry, in particular in the semiconductor technology. With the aid of etching processes fine structures are prepared down to the nanometre range. Further, etching processes have an important function at the repair of photolithography masks.

For the fabrication of fine structures by means of etching processes, as they are used in the semiconductor technology, etching under the impact of a focused ion beam is known in the prior art as FIB (focused ion beam). For example, the FIB technology is disclosed in the U.S. Pat. No. 4,639,301. The specific advantage of the FIB technology is that this method allows the manufacturing of flat and steep side walls, i.e. structure with a large aspect ratio at a high etching rate. The aspect ratio indicates the ratio of the depth or height, respectively, of a structure to its smallest lateral extension.

At the FIB technology, the ion beam consists regularly of gallium (Ga) ions. During the repairing of photolithography masks, the implantation of gallium in the quartz substrate results in an impairment of the transmission behaviour with respect to the ultraviolet (UV) radiation which is used for the exposition. The US 2004/0226814 A1 discloses a method with which the transmission behaviour of a quartz substrate can again be reconstructed to a large extent without changing significantly the thickness of the substrate layer. The quartz substrate has been blurred with respect to UV radiation by the bombardment with gallium ions. For this purpose, the areas of the quartz substrate on which gallium ions are implanted are cleared with the aid of an electron beam and the etching gas xenon difluoride ($XeF_2$). The essential precondition in this process is that the substrate is not etched by the combined impact of an electron beam and of $XeF_2$. A removal of substrate material would locally change the substrate thickness and would therefore generate phase errors at the exposition with UV radiation. This would result in image defects of the photolithography mask. Thus, at the end this would replace the defect of insufficient transmission by the defect of insufficient image quality of the photolithography mask.

The implementation of gallium in a layer below the layer to be processed is a general problem of the FIB technology and occurs in parallel to the above described mask repairing process also at the so-called circuit editing, i.e. the directed modification of microscopic structures in the semiconductor technology in which for example electrically conductive paths of a device are subsequently disconnected or connected with each other.

The implantation of gallium in a semiconductor layer, as it is for example occurring by the bombardment of gallium at the FIB technology, complicates the further processing of this layer significantly. In particular, the etching of this layer is extremely difficult. At the removal of larger volumes, in which gallium has been implanted, regularly stay inert residua, which are a problem at the further processing. As a consequence of the difficult removal of a layer contaminated with gallium, the etching of deep contacts holes or vias in a multi-layered system having a layer contaminated with gallium results in a bottleneck in the range of this layer (cf. FIG. 5). Moreover, the adsorption of gallium residuals to the further layers of the multi-layered system significantly complicates the further processing. A further serious disadvantage of the FIB technology is that a large extent of the sputtered material is adsorbed at other positions of the sample or within the vacuum chamber.

The present invention is therefore based on the problem to indicate a method for essentially residue-free etching of a layer contaminated with gallium and therefore to avoid at least partly the above-mentioned disadvantages.

3. SUMMARY OF THE INVENTION

According to an embodiment of the present invention this problem is solved by a method for electron beam induced etching of a layer contaminated with gallium, which comprises providing at least one first halogenated compound as an etching gas at a position at which an electron beam impacts on the layer and providing at least one second halogenated compound as a precursor gas at this position.

Applicant has surprisingly detected that a layer contaminated with gallium can be removed by electron beam induced etching using an appropriate precursor gas. By the addition of a precursor gas inert residua can to a large extent be avoided which are known from the prior art when larger volumes are removed which are contaminated with gallium. When etching a multi-layered system having at least a layer contaminated with gallium, the addition of an appropriate precursor gas avoids or reduces the adsorption of gallium residuals at the other layers. Thus, the inventive method allows an essentially residue-free etching of a layer contaminated with gallium. Moreover, the addition of a precursor gas when etching layers contaminated with gallium can reduce the selectivity of the etching process compared with layers having no gallium implanted. For this reason, the formation of bottlenecks can be avoided when etching vias.

In a preferred embodiment of the inventive method, xenon difluoride ($XeF_2$) is used as a first halogenated compound. However, it is also conceivable to apply other halogenated compounds, as for example a halogen (bromine ($Br_2$) and/or iodine ($I_2$)), or other compounds as etching gases, as for example sulphur hexafluoride ($SF_6$) or oxygen ($O_2$)).

Preferably chlorine ($Cl_2$) is used as a second halogenated compound. However, the inventive method is not restricted to the application of $Cl_2$ as a precursor gas. It is conceivable to use other precursor gases, as for example a different halogen, halogenated compounds, or oxidizing compounds.

In a preferred embodiment of the inventive method good etching results are obtained when continuously providing the second halogenated compound during the etching. In a particularly preferred embodiment of the inventive method good etching results are obtained at a gas flow rate of the second halogenated compound of 0.1 sccm (standard cubic centimetres per minute).

Preferably the first halogenated compound is provided temporally varying during the etching process. In an embodiment the first halogenated compound is chopped with a duty cycle of 1:5 with a clock rate of 30 s (seconds).

In an embodiment of the inventive method when etching a via through a multi-layered system having a layer contaminated with gallium, the gas flow of the second halogenated compound is larger when etching the at least one layer contaminated with gallium than when etching layers which are not contaminated with gallium.

In a further preferred embodiment of the inventive method, a cold trap and/or an ultraviolet lamp reduces the water partial pressure in a vacuum chamber.

Preferably the electron beam of the electron beam apparatus is additionally or alternatively used to investigate the surface of the layer to be etched and/or of the layer which has been etched. In addition or parallel to the electron beam microscopy also other methods can be applied, as for example Auger electron spectroscopy (AES), photoelectron spectroscopy (XPS), scanning tunnelling microscopy and/or scanning force microscopy. The combination of these techniques is also possible.

According to a further aspect of the present invention, an apparatus for electron beam induced etching having a layer with implanted gallium has an inlet for one first halogenated compound. The inlet is at a position at which the electron beam impacts on the layer. Furthermore, the apparatus has an inlet for at least one second halogenated compound as a precursor gas at this position.

Further embodiments of the inventive methods are defined in further dependent patent claims.

4. DESCRIPTION OF THE DRAWINGS

In the following detailed description presently preferred embodiments of the invention are described with reference to the drawings, wherein FIG. 1 shows a schematic representation of an exemplary apparatus for the realization of the method, wherein a sample having at least a layer contaminated with gallium can be etched in a vacuum chamber by the combined impact of an etching gas, a precursor gas and a focused electron beam;

5. DETAILED DESCRIPTION OF PREFERRED EMBODIMENTS

In the following preferred embodiments of the inventive method and of the inventive apparatus will be explained in detail.

Figure 1:
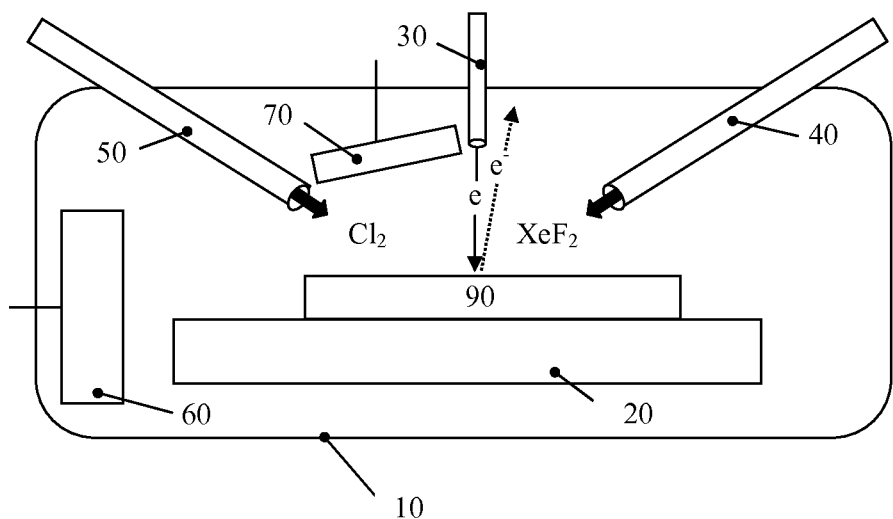

FIG. 1 shows schematically that a sample 90 to be etched is arranged on a sample holder 20 in a vacuum chamber 10. The sample 90 comprises in FIGS. 2 and 3 a multi-layered system 100 and in FIGS. 4-6 a multi-layered system 200. The electron beam for the realization of the inventive method is coming from an electron beam device 30, which is for example a modified scanning electron microscope.

In the preferred embodiment of the present invention schematically shown in FIG. 1, the halogenated compound $XeF_2$ is introduced as etching gas via the inlet 40 in the vacuum chamber 10. In addition to $XeF_2$ also other halogens can be applied, as for example $Cl_2$, $Br_2$ and/or $I_2$ as well as halogenated compounds can be used, as for example $SF_6$. In parallel to halogenated compounds also water ($H_2O$), nitrogen monoxide (NO), nitrogen dioxide ($NO_2$), ammonia ($NH_3$) and other reactive substances are conceivable. Further, the inventive method also allows the concurrent application of more than one etching gas. Moreover, the mixing ratio of different etching gases can change during the etching process.

In the embodiment represented in FIG. 1, the precursor gas $Cl_2$ is introduced via the inlet 50 in the vacuum chamber 10. It is conceivable to use in parallel to $Cl_2$ also other halogens, as for example $Br_2$ and/or $I_2$ and/or other halogenated compounds, as for example $SF_2$ as precursor gases. In parallel to halogenated compounds also water ($H_2O$), nitrogen monoxide (NO), nitrogen dioxide ($NO_2$), ammonia ($NH_3$) and other reactive substances are conceivable. Two or more gases or materials, respectively, can also be considered as precursor gases, and their mixing ratio can change in the course of the etching process.

$XeF_2$ as well as $Cl_2$ are brought up to the multi-layered systems 100, 200 to be etched via appropriate dosing valves (not shown in FIG. 1) through the corresponding inlets 40, 50. In this process, it is possible to introduce both gases $XeF_2$ and $Cl_2$ via separate dosing valves but a common inlet (not represented in FIG. 1). Alternatively to a gas inlet 40, 50 directed to the layer to be etched, the first and/or the second halogenated compound can also be introduced undirected in the vacuum chamber 10.

The dosage of $XeF_2$ and $Cl_2$ can be temporally uniform. It is also possible to change the dosage of both gases and/or of one of the two gases during the etching process ("chopping"). At the etching of a semiconductor layer contaminated with gallium good results are obtained if the precursor gas is continuously provided with a gas flow rate of 0.1 sccm. At the same time, the etching gas $XeF_2$ is preferably provided temporally varying at a temperature of 273 K. In this process, the duty cycle is 1:5 and the cycle length is 30 s (seconds). This means that for 5 seconds $XeF_2$ is introduced in the vacuum chamber 10 via the inlet 40 and for the next 25 seconds a valve in the inlet 40 (not shown in FIG. 1) interrupts the supply of the etching gas. For example, the inventive method can be realized with a gas flow rate of approximately 0.5 sccm (stand cubic centimetres per minute).

Electron beam induced etching using chlorine as precursor gas involves some challenges for the equipment. In an untreated vacuum chamber 10 of the electron beam device 30 the reactivity of chlorine releases so much residual gas in the vacuum chamber 10, for example hydrocarbons that the deposition of the released residual gases impedes the etching of the sample 90 to be etched. A further probable reaction path in the vacuum chamber 10 at the supply of chlorine, which additionally generates appropriate molecules for the deposition on the layer to be etched, is the spontaneous reaction of chlorine with water molecules, available in the vacuum chamber 10 as residual gas, to hydrogen chloride (HCl). HCl is a polar compound which significantly better adheres to the sample to be etched 90 than the less polar water molecules do. Therefore, water vapour desorbing methods are helpful in the vacuum chamber 10.

Different actions can be taken to prevent the contamination problems described in the preceding section when introducing chlorine via the inlet 50 in the vacuum chamber 10. As non-closing samples are mentioned here: heating of the vacuum chamber 10, cleaning of the vacuum chamber 10 by means of a plasma, the application of a cryogenic pump, or of a cold trap 60 to increase the pumping power for water as well as the support of the desorption of water from the surfaces of the vacuum chamber 10 and of the sample 90 by irradiation with ultraviolet light.

The parameters of the electron beam can be adjusted in dependence of the material composition of the layer contaminated with gallium. In an exemplary parameter set an electron beam is used with an electron energy of 1 keV, a strength of current of 50 pA, a dwell time of 50 ns and a refresh time of 2 ms.

For initializing the etching reaction preferably a focused electron beam is exclusively used. However, in addition or alternatively other energy transferring mechanisms can also be used (for example a focused laser beam and/or an unfocused ion beam).

Figure 2:
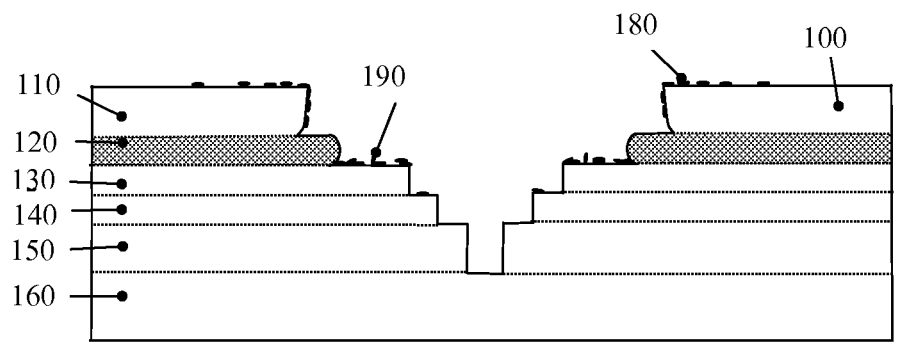
FIG. 2 shows a schematic enlarged cross section through a multi-layered system having a large volume layer contaminated with gallium which has been etched with a method according to the prior art.

As already mentioned, two different problems occur when etching layers contaminated with gallium. The removal of large volumes forms areas which persistently persist the removal by the etching process, which are the so-called inert residua when an electron beam induced etching according to a method of the prior art is used. FIG. 2 shows in multi-layered system 100 whose second uppermost layer 120 is contaminated with gallium. The layer contaminated with gallium is a semiconductor layer 120. However, it is also possible that gallium is by ion bombardment implanted in an isolation layer to be etched. In the example of FIG. 2, the further layers 110, 130, 140, 150 and 160 are semiconductor layers of different composition and/or doping which are not contaminated with gallium. Further, in the example of FIG. 2, the area of the material to be removed gets in steps smaller from layer to layer. By the etching process access is to be provided to the lowest layer 160. Due to the different etching rates of the layer 120 contaminated with gallium, of the overlying layer 110 and the underlying layer 130 which have essentially no implanted gallium, the layer 100 is under-cut. The expression "essentially" means here and at other positions within this description a concentration below the detection limit or a concentration within the measuring inaccuracy, respectively.

At an electron beam induced etching process, when etching the layer 120 contaminated with gallium according to the prior art, inert residuals 190 remain which can not be removed by the etching process. Moreover, at the removal of the layer 120 contaminated with gallium, gallium residuals 180 removed from the layer 120 deposit at the highest layer 110 which has been etched at first.

Figure 3:
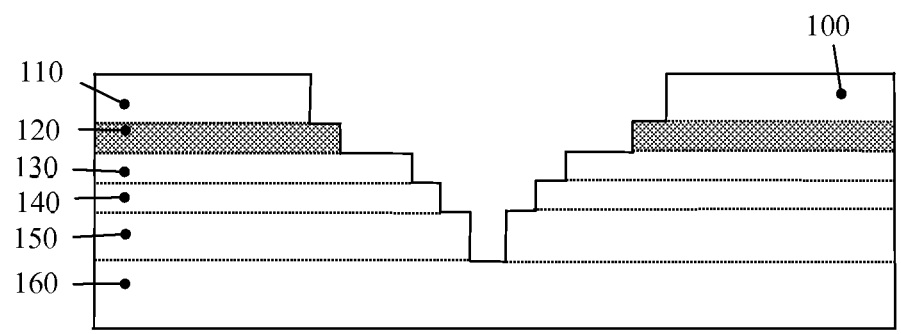
FIG. 3 shows a schematic enlarged cross section through a multi-layered system having a large volume layer contaminated with gallium which has been etched with an embodiment of the inventive method.

FIG. 3 shows the multi-layered system 100 discussed in FIG. 2 after the application of the inventive etching method. By the addition of the precursor gas, the selectivity of the gallium implanted layer 120 is significantly reduced compared to the layers 110, 130, 140, 150 and 160 which are not contaminated with gallium. For this reason, an under-cutting of the first layer 110 is avoided to a large extent. The application of the precursor gas chlorine enables an essentially residual-free removal of the layer 120 contaminated with gallium. Inert residuals 190 do essentially not remain on the layer 120. Gallium residuals do not adsorb or adsorb only to a small extent on the layer 110.

Figure 4:
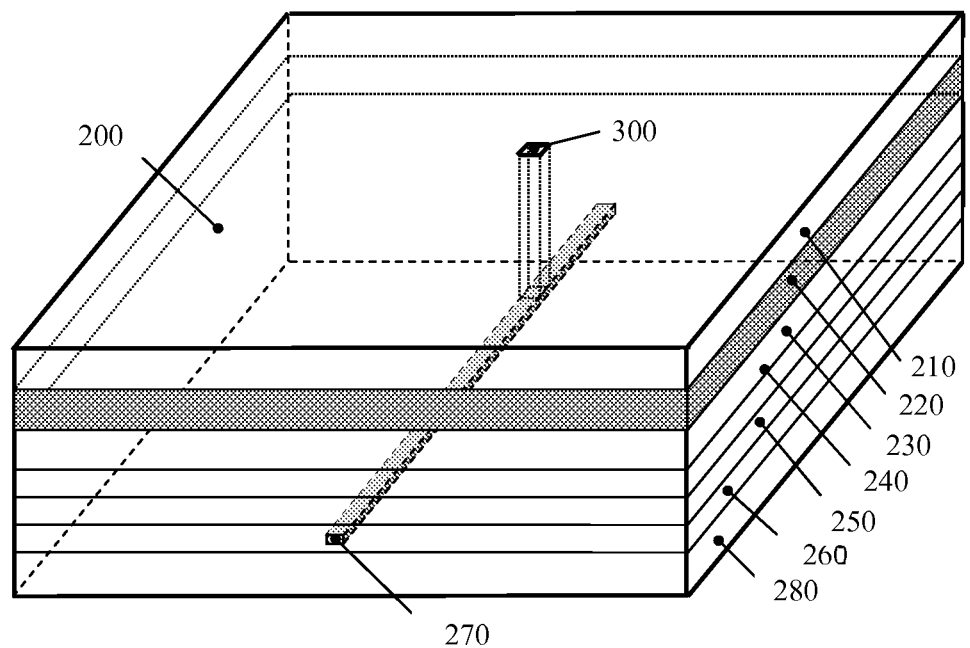
FIG. 4 shows a schematic enlarged representation of a via which has been etched through several layers of a multi-layered system having a layer contaminated with gallium.

FIG. 4 schematically represents etching of a via 300 through several layers 210 to 260 down to a metallically conductive connection 270 in a multi-layered system 200. As in FIGS. 2 and 3, the second uppermost semiconductor layer 220 is again contaminated with gallium. The other layers 210, 230, 240, 250, 260, 270 and 280 are essentially free of gallium contaminations. The uppermost layer 210 of the multi-layered system 200 is an isolation layer. The layers 230, 240, 250, and 280 are semiconductor layers, isolators and/or metals of different material composition and/or doping. The metallic conducting connection 270 is embedded in the isolation layer 260. In contrast to the representation of FIG. 4, at the application of the FIB technology, gallium can also be implanted in an isolation layer by ion bombardment. The overlying and/or the underlying layer can be isolation layers, metal layers and/or semiconductor layers. Using an inventive method, these multi-layered systems can also successfully be etched.

Figure 5:
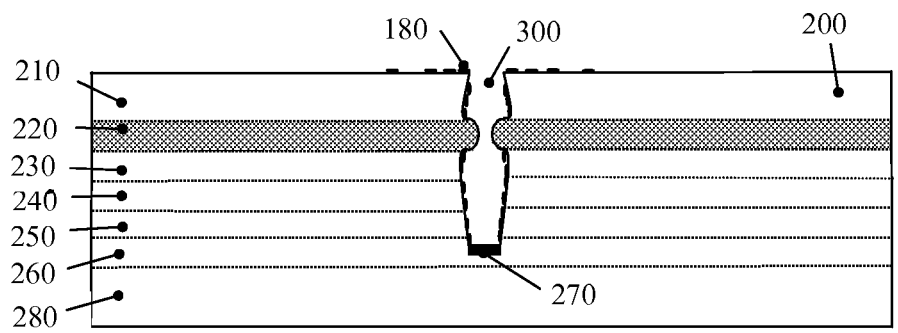
FIG. 5 shows a schematic cross section of the via of FIG. 4 when the etching has been performed using a method according to the prior art.

FIG. 5 shows a cross section through a via 300 of a multi-layered system 200 of FIG. 4 when the removal occurred with an electron beam induced etching method according to the prior art. Due to the different etching rates of the layer 220 on the one hand and of the isolation layer 210 and the semiconductor layer 230 on the other hand, the neighboring layers 210 and 230 show under-cuttings. In the layer 220 the low etching rate forms a bottle neck. The gallium removed from the layer 220 adsorbs as gallium residuals on the other layers 210, 230, 240, 250, 260 and 270 of the multi-layered system 200.

Figure 6:
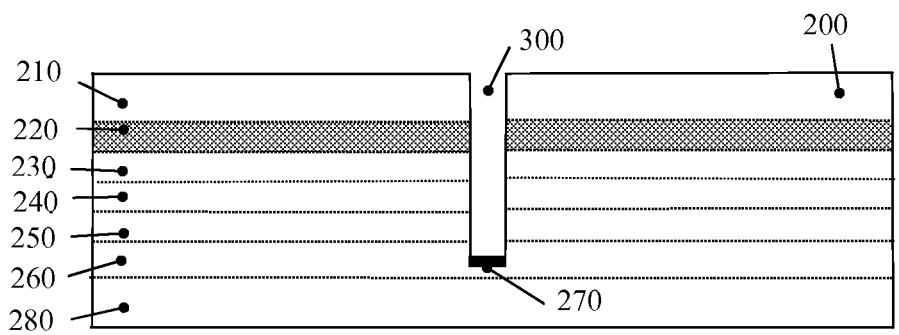
FIG. 6 shows a schematic cross section of the via of FIG. 4 when the etching has been preformed using an inventive method.

FIG. 6 also presents a cross section through the via 300 of the multi-layered system 200 of FIG. 4, wherein the etching was now performed with the inventive method. As already explained at the discussion of FIG. 4, the addition of chlorine in the vacuum chamber 10 via the inlet 50 reduces the selectivity of the etching rate between the layers 210 and 230 on the one hand and the layer 220 on the other hand. Thus, an under-cutting of the layers 210 and 230 can efficiently be avoided. Moreover the formation of a bottleneck in the range of the layer 220 can be avoided or can significantly be reduced, respectively. As a consequence of the essentially residual-free etching of the inventive method, the adsorption of gallium residuals 180 on the other layers 210, 230, 240, 250, 260 and 270 of the multi-layered system 200 can also essentially be avoided.

The invention claimed is:

1. A method, comprising:
providing a first gas at a position at which an electron beam impacts a layer including gallium to etch the layer; and
providing a second gas to the position to remove the gallium,
wherein the method is performed without forming inert residua, the layer is a semiconductor layer or an isolation layer, the first gas is different from the second gas, the first gas is a halogenated gas, and the second gas is a halogenated gas.

2. The method of claim 1, wherein the first gas comprises xenon difluoride.

3. The method of claim 2, wherein the second gas comprises chlorine gas.

4. The method of claim 1, wherein the second gas comprises chlorine gas.

5. The method of claim 1, comprising continuously providing the second gas.

6. The method of claim 5, comprising providing the second gas at a gas flow rate of 0.1 standard cubic centimetres per minute.

7. The method of claim 1, comprising temporally varying the provision of the first gas.

8. The method of claim 7, comprising providing the first gas with a duty cycle of 1:5 chopped with a clock rate of 30 seconds.

9. The method of claim 1, wherein a multi-layered system comprises the layer including the gallium, the method comprises etching a via through the multi-layered system, and a gas flow of the second gas is greater when etching the layer including the gallium than when etching the layers which are not contaminated with gallium.

10. The method of claim 1, wherein the method is performed in a vacuum chamber, and a vapour partial pressure in the vacuum chamber is reduced with a cold trap and/or an ultraviolet lamp.

11. The method of claim 1, comprising, before providing the first gas, imaging a surface of the layer including the gallium with an electron beam.

12. The method of claim 1, comprising, after etching the layer including the gallium, imaging a surface of the layer with an electron beam.

13. The method of claim 1, wherein the first gas comprises a gas selected from the group consisting of bromine gas, iodine gas, sulphur hexafluoride and oxygen.

14. A method, comprising:
variably providing a first gas at a position at which an electron beam impacts a layer including gallium to etch the layer; and
continuously providing a second gas to the position to remove the gallium,
wherein the first gas is different from the second gas, the layer is a semiconductor layer or an isolation layer, and the method is performed without forming inert residua.

15. The method of claim 14, wherein the first gas comprises a first halogenated gas.

16. The method of claim 15, wherein the second gas comprises a second halogenated gas.

17. The method of claim 14, wherein the second gas comprises a second halogenated gas.

18. The method of claim 14, wherein the first gas comprises a gas selected from the group consisting of bromine gas, iodine gas, sulphur hexafluoride and oxygen.

19. The method of claim 14, wherein a multi-layered system comprises the layer including the gallium, the method comprises etching a via through the multi-layered system, and a gas flow of the second gas is greater when etching the layer including the gallium than when etching the layers which are not contaminated with gallium.

20. The method of claim 14, wherein the first gas comprises xenon difluoride, and the second gas comprises chlorine gas.

21. A method, comprising:
impacting an electron beam on a multi-layered system comprising a layer including gallium;
providing a first gas to the multi-layered system to etch a via through the multi-layered system including etching the layer including the gallium; and
providing a second gas to the multi-layered system to remove the gallium,
wherein the first gas is different from the second gas, the second gas is a halogenated gas, and a gas flow of the second gas is greater when etching the layer including the gallium than when etching layers in the multi-layer system which are not contaminated with gallium.

22. A method, comprising:
impacting an electron beam on a multi-layered system comprising a layer including gallium;
variably providing a first gas to the multi-layered system to etch a via through the multi-layered system including etching the layer including the gallium; and
continuously providing a second gas to the multi-layered system to remove the gallium,
wherein the first gas is different from the second gas, and a gas flow of the second gas is greater when etching the layer including the gallium than when etching layers of the multi-layer system which are not contaminated with gallium.

23. A method, comprising:
providing a first gas at a position at which an electron beam impacts a layer including gallium to etch the layer; and
providing a second gas to the position to remove the gallium,
wherein the first gas is different from the second gas, the first gas is a halogenated gas, the second gas is a halogenated gas, a multi-layered system comprises the layer including the gallium, the method comprises etching a via through the multi-layered system, and a gas flow of the second gas is greater when etching the layer including the gallium than when etching the layers which are not contaminated with gallium.

24. A method, comprising:
variably providing a first gas at a position at which an electron beam impacts a layer including gallium to etch the layer; and
continuously providing a second gas to the position to remove the gallium,
wherein the first gas is different from the second gas, a multi-layered system comprises the layer including the gallium, the method comprises etching a via through the multi-layered system, and a gas flow of the second gas is greater when etching the layer including the gallium than when etching the layers which are not contaminated with gallium.

* * * * *